United States Patent [19]
Huang

[11] Patent Number: 6,156,648
[45] Date of Patent: Dec. 5, 2000

[54] METHOD FOR FABRICATING DUAL DAMASCENE

[75] Inventor: Yimin Huang, Taichung Hsien, Taiwan

[73] Assignee: United Microelectronics Corp., Taiwan

[21] Appl. No.: 09/265,207

[22] Filed: Mar. 10, 1999

[51] Int. Cl.$^7$ .................................................. H01L 21/44
[52] U.S. Cl. .......................................... 438/654; 438/654
[58] Field of Search ................................. 438/619, 624, 438/627, 637, 638, 639, 640, 678, 687, 692, 672, 629; 427/98; 205/184

[56] References Cited

U.S. PATENT DOCUMENTS

| | | | |
|---|---|---|---|
| 5,821,168 | 10/1998 | Jain | 438/692 |
| 5,891,513 | 4/1999 | Dubin | 427/98 |
| 5,968,333 | 10/1999 | Nogami | 205/184 |
| 6,017,817 | 1/2000 | Chung | 438/637 |
| 6,040,243 | 3/2000 | Li | 438/687 |

*Primary Examiner*—David Nelms
*Assistant Examiner*—David Nhu
*Attorney, Agent, or Firm*—Thomas, Kayden, Horstemeyer & Risley, L.L.P.

[57] ABSTRACT

A method for fabricating a dual damascene structure. A cap layer and a dielectric layer are formed in sequence over a substrate having a first conductive layer. A trench and a via hole are formed in the dielectric layer. The via hole is aligned under the trench. A barrier spacer is formed on sidewalls of the trench and the via hole. The cap layer exposed by the via hole is removed. A conformal adhesion layer is formed over the substrate. A second conductive layer is formed over the substrate and fills the trench and the via hole. A portion of the second conductive layer and the adhesion layer are removed to expose the dielectric layer.

20 Claims, 3 Drawing Sheets

METHOD FOR FABRICATING DUAL DAMASCENE

BACKGROUND OF THE INVENTION

1. Field of the Invention

The present invention relates to a method for fabricating multilevel interconnects. More particularly, the present invention relates to a method for fabricating a dual damascene structure.

2. Description of the Related Art

Since copper has many good qualities such as a high melting point, a high electromigration resistance and a low resistance, it is widely used in sub-micron process to form multilevel interconnects. However, some problems stated below occur when using copper in sub-micron process. Copper is easily oxidized and eroded. It is difficult to pattern copper by dry etching. The adhesion between copper and dielectric materials is poor. Additionally, copper easily diffuses into the dielectric materials so that the reliability of devices is decreased.

A dual damascene structure is used to solve the above problems. The dual damascene structure is a technique for forming metal interconnects in a dielectric layer. The method for fabricating a dual damascene structure comprises the following steps. A dielectric layer is formed on a substrate, and planarized. The dielectric layer is etched to form a trench and a via hole based on the pattern of connecting wires to be subsequently formed. A copper layer is deposited in the trench and the via hole to form a connecting wire and a via, respectively. Chemical-mechanical polishing is performed to planarize the copper layer. A cap layer is formed on the copper layer. In the dual damascene structure process, etching is not performed, and thus the problem of patterning copper is avoided. Before filling the trench and the via hole with copper, a barrier layer is formed to prevent copper from diffusing into the dielectric layer. The cap layer is formed to prevent the copper layer from oxidizing.

FIGS. 1A through 1C are schematic, cross-sectional diagrams used to depict steps in a conventional method for fabricating a dual damascene structure.

Referring to FIG. 1A, a cap layer 104 and a dielectric layer 106 are formed in sequence on a substrate 100 having a copper layer 102. A trench 108 and a via hole 110, which expose the copper layer 102, are formed in sequence in the dielectric layer 106 and the cap layer 104.

Referring to FIG. 1B, a conformal barrier layer 112 is formed over the substrate 100. A copper layer 114 is formed on the dielectric layer 106 and fills the trench 108 and the via hole 110.

Referring to FIG. 1C, a portion of the copper layer 114 and a portion of the barrier layer 112 are removed by chemical-mechanical polishing to expose the dielectric layer 106.

In the steps mentioned above, the trench 108 and the via hole 110 are formed by reactive ion etching. During the etching process, the copper layer 102 is bombarded so that copper particles are sputtered and deposited on the sidewall of the via hole 110. Furthermore, the copper layer 102 is easily oxidized. To prevent oxides from forming on the copper layer 102 where the oxide would decrease the conductivity of the metal wires, a radio-frequency cleaning process with argon ions is performed to remove the oxides before forming the barrier layer 112. During the cleaning process, copper particles are also possibly sputtered and deposited on the sidewall of the via hole 110. No other materials are formed on the sidewall of the via hole 110 to prevent the copper particles from diffusing into the dielectric layer 106. Thus, the copper particles deposited on the sidewall of the via hole 110 diffuse into the dielectric layer 106 and decrease the reliability of devices.

The barrier layer 112 is made from titanium nitride. However, the adhesion between titanium nitride and copper is poor. Tantalum and tantalum nitride have better adhesion with copper, but only ionized metal plasma technique can form a tantalum layer or a tantalum nitride layer. The step coverage of the ionized metal plasma technique is poor. To obtain enough barrier thickness on the sidewalls of the trench 108 and the via hole 110, a thicker tantalum layer or a tantalum nitride layer must be formed. Because of the poor step coverage of the ionized metal plasma technique, a portion of the tantalum layer or the tantalum nitride layer on the dielectric layer 106 is too thick, although the thickness of the tantalum layer or the tantalum nitride layer formed on sidewalls of the trench 108 and the via hole 110 is just enough. This increases the time for performing chemical-mechanical polishing to remove the redundant tantalum layer or tantalum nitride layer. Furthermore, tantalum and tantalum nitride are both harder than copper, and a dishing effect or an erosion effect that occurs on the copper layer 114 in the trench 108 worsens, as indicated by reference numeral 116 shown in FIG. 1C, after chemical-mechanical polishing.

SUMMARY OF THE INVENTION

Accordingly, the purpose of the present invention is to provide a method for fabricating a dual damascene structure that prevents copper particles from diffusing into a dielectric layer.

The purpose of the invention is also to provide a method for fabricating a dual damascene structure that reduces a dishing effect and an erosion effect.

To achieve these and other advantages and in accordance with the purpose of the invention, as embodied and broadly described herein, the invention provides a method for fabricating a dual damascene structure. The method includes the following steps. A cap layer and a dielectric layer are formed in sequence over a substrate having a first conductive layer. A trench and a via hole are formed in the dielectric layer. The via hole is aligned under the trench. A barrier spacer is formed on sidewalls of the trench and the via hole. The cap layer exposed by the via hole is removed. A conformal adhesion layer is formed over the substrate. A second conductive layer is formed over the substrate and fills the trench and the via hole. A portion of the second conductive layer and the adhesion layer arc removed to expose the dielectric layer.

In the invention, the barrier spacer can prevent copper particles, sputtered during, the process of removing the cap layer exposed by the via hole, from diffusing into the dielectric layer. Because the barrier spacer also provides barrier capability, the adhesion layer is thin. Because a portion of the adhesion layer on the dielectric layer is thin, the time for removing the redundant adhesion layer is reduced. The dishing effect and the erosion effect are reduced, too.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
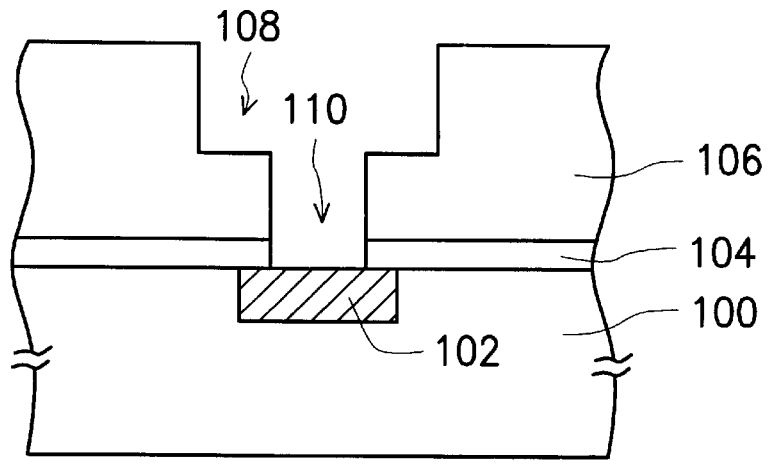
FIGS. 1A through 1C are schematic, cross-sectional diagrams used to depict steps in a conventional method for fabricating a dual damascene structure.
Figure 1B:
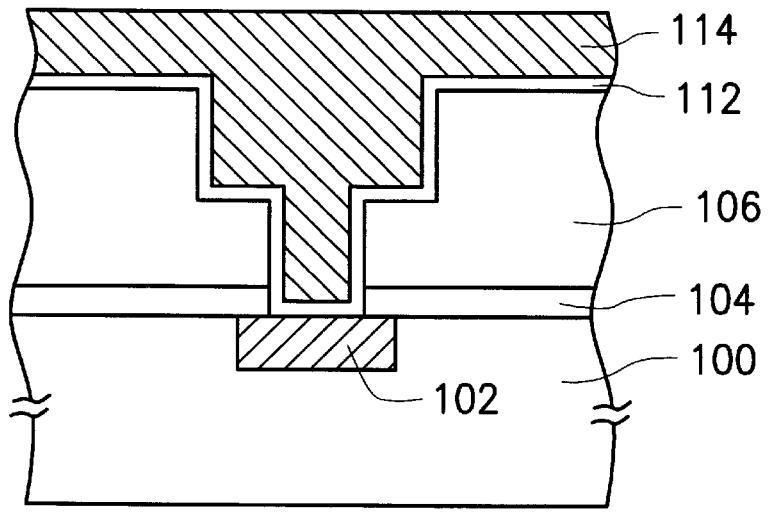
Figure 1C:
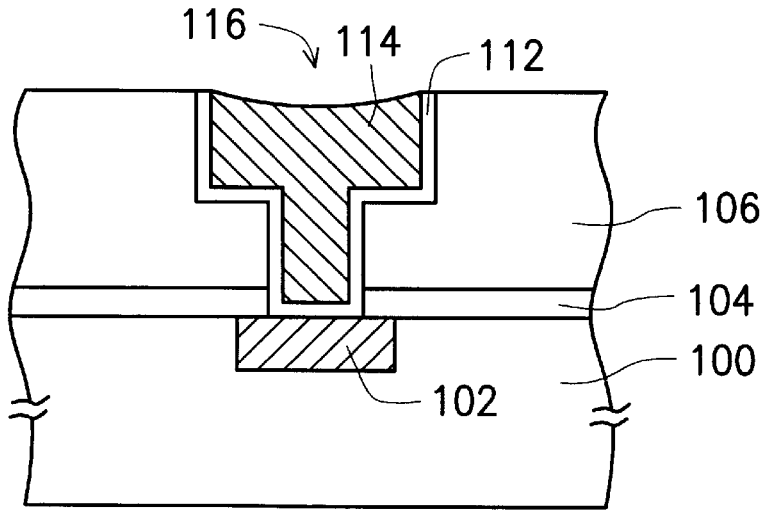

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic, cross-sectional diagrams used to depict steps in a method according to the invention for fabricating a dual damascene structure.

Figure 2A:
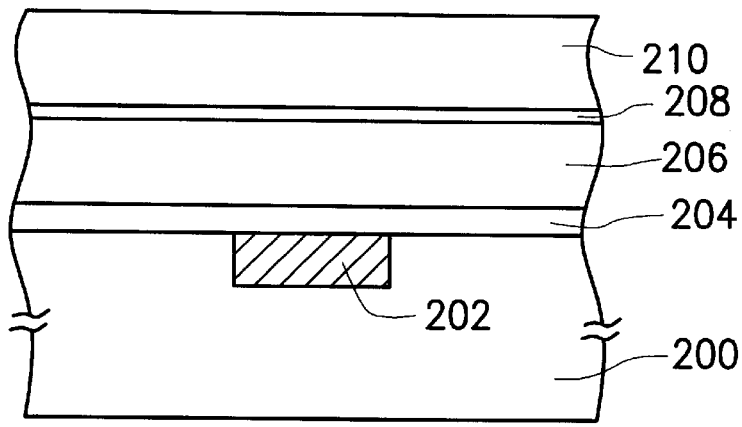
FIGS. 2A through 2F are schematic, cross-sectional diagrams used to depict steps in a method according to the invention for fabricating a dual damascene structure.

Referring to FIG. 2A, a dielectric layer 206 is formed on a substrate 200 having a conductive layer 202 and a cap layer 204 formed thereon. The conductive layer 202 includes copper. The cap layer 204 prevents the conductive layer 202 from oxidizing and also prevents components of the conductive layer 202 from diffusing into the dielectric layer 206. When the conductive layer 202 is made from copper, the cap layer 204 is made from silicon nitride formed by chemical vapor deposition. A stop layer 208 and a dielectric layer 210 are formed in sequence on the dielectric layer 206. The dielectric layer 206 and the dielectric layer 210 includes silicon dioxide, fluorine doped silicon oxide or phosphosilicate glass. The stop layer 208, whose etching rate is different from that of the dielectric layer 210, includes silicon nitride or silicon-oxy-nitride. The step of forming the stop layer 208 includes chemical vapor deposition.

Figure 2B:
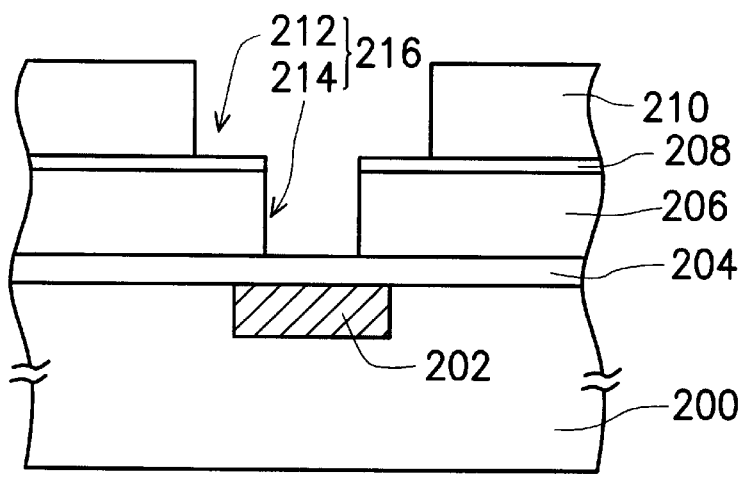

Referring to FIG. 2B, a trench 212 and a via hole 214 are formed in the dielectric layer 210, the stop layer 208 and the dielectric layer 206. The via hole 214 is aligned under the trench 212 and the via hole 214 is narrower than the trench 208.

Figure 2C:
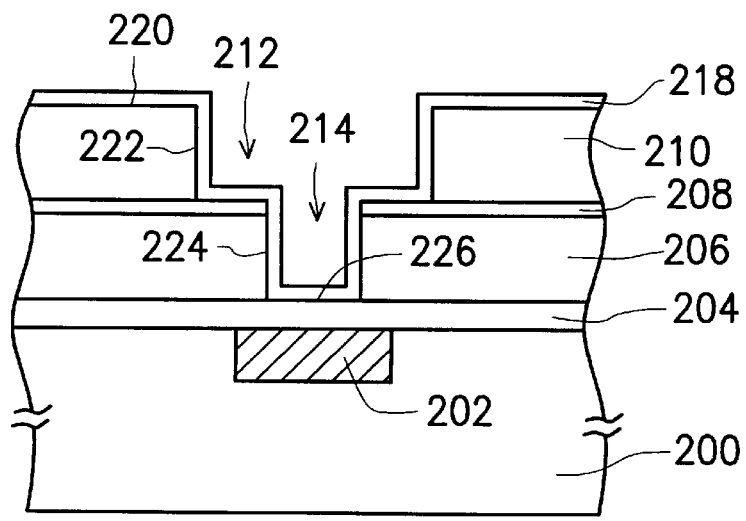

Referring to FIG. 2C, a conformal barrier layer 218 is formed over the substrate 200. Preferably, the barrier layer 218 includes titanium nitride formed by chemical vapor deposition and the thickness of the barrier layer 28 is about 100 to 200 angstroms.

Figure 2D:
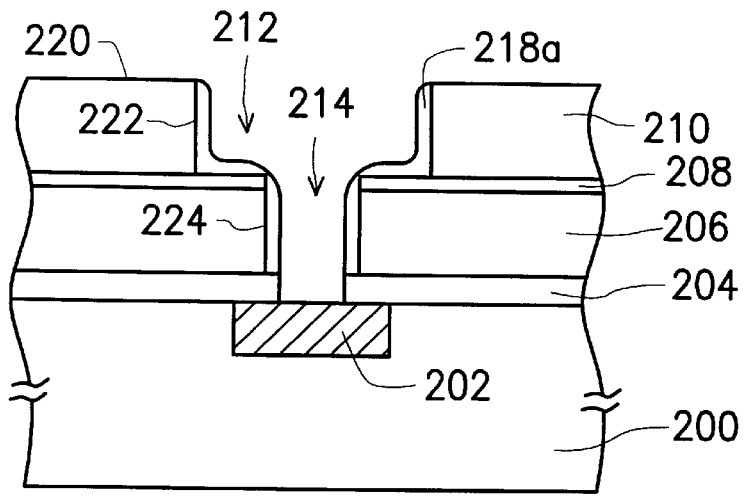

Referring to FIG. 2D, a portion of the barrier layer 218 is removed to expose the dielectric layer 210, thus a barrier spacer 218a is formed on a sidewall 222 of the trench 212 and a sidewall 224 of the via hole 214. The step of removing the barrier layer 218 includes etching back. The cap layer 204 exposed by the via hole 214 is removed to expose the conductive layer 202. The step of removing the cap layer 204 includes reactive ion etching. The barrier spacer 218a prevents particles sputtered from the conductive layer 202 from diffusing into the dielectric layers 210 and 206 during the process of removing the cap layer 204 exposed by the via hole 214.

Figure 2E:
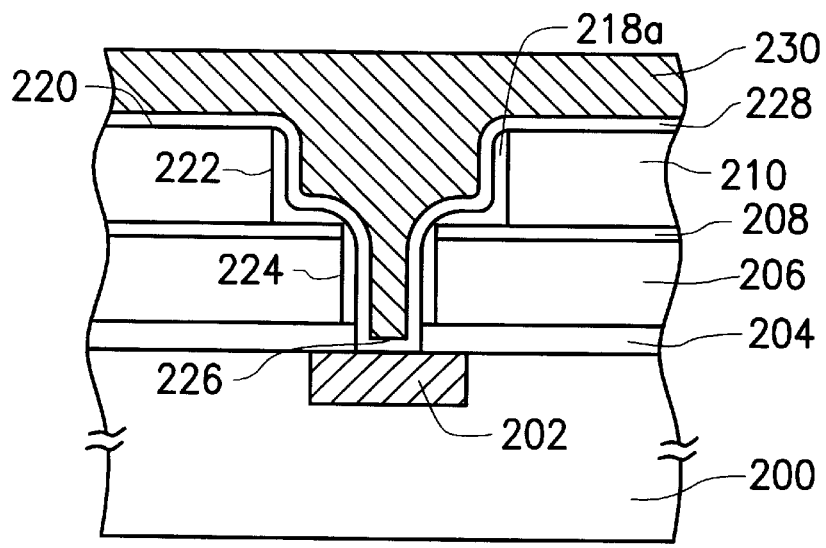

Referring to FIG. 2E, a conformal adhesion layer 228 is formed over the substrate 200. The adhesion layer 228 increases the adhesion force between the barrier spacer 218a and subsequently filled conductive material. The adhesion layer 228 includes tantalum or tantalum nitride and the step of forming the adhesion layer 228 includes ionized metal plasma. The thickness of the adhesion layer 228 is about 50 to 150 angstroms. Before forming the adhesion layer 228, a cleaning step is performed to remove metal oxide formed on the conductive layer 202. The step of removing the metal oxide formed on the conductive layer 202 includes a radio-frequency cleaning process with argon ions. During the cleaning process, the barrier spacer 218a and the adhesion layer 228 can prevent particles sputtered from the conductive layer 202 from diffusing into the dielectric layers 210 and 206.

A conductive layer 230 is formed over the substrate 200 and fills the trench 212 and the via hole 214. The conductive layer 230 includes copper formed by chemical vapor deposition.

Figure 2F:
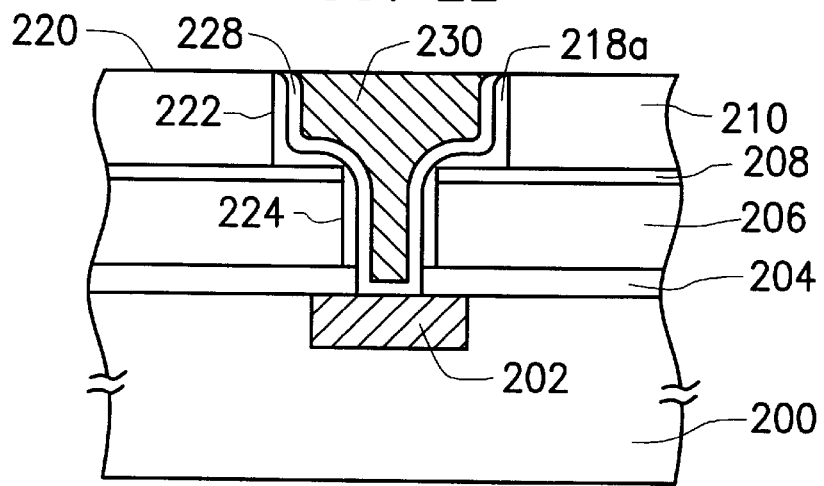

Referring to FIG. 2F, a portion of the adhesion layer 228 and a portion of the conductive layer 230 are removed to expose the dielectric layer 210. The step of removing the adhesion layer 228 and the conductive layer 230 includes chemical-mechanical polishing. In the invention, the adhesion layer 228 and the barrier spacer 218a all have barrier capabilities; thus the adhesion layer 228 is thin. The time for performing chemical-mechanical polishing to remove the redundant adhesion layer 228 is reduced. The dishing effect or the erosion effect that occurs on the conductive layer 230 in the trench 212 is decreased.

According to the foregoing, the advantages of the invention include the following:

1. Particles sputtered from the conductive layer can not diffuse into the dielectric layer because of the barrier spacer.

2. Since the barrier spacer also has barrier capabilities, the thinner adhesion layer can be used to prevent particles sputtered from the conductive layer from diffusing into the dielectric layer. Furthermore, the time for removing the redundant adhesion layer on the dielectric layer is reduced because the adhesion layer is thin.

3. Via resistance is reduced because of the thin adhesion layer between the conductive layer in the trench and the via hole and the conductive layer in the substrate.

4. The method according to the invention is compatible with the conventional process.

It will he apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a dual damascene structure, comprising the steps of:

forming a dielectric layer having a trench and a via hole over a substrate having a first conductive layer and a cap layer formed thereon, wherein the via hole is aligned under the trench and the via hole exposes a portion of the cap layer above the first conductive layer;

forming a barrier spacer on sidewalls of the trench and the via hole and removing the portion of the cap layer exposed by the via hole until the first conductive layer is exposed;

forming a conformal adhesion layer over the substrate; and filling the trench and the via hole with a second conductive material.

2. The method of claim 1, wherein the barrier spacer includes titanium nitride formed by chemical vapor deposition.

3. The method of claim 2, wherein the conformal adhesion layer includes tantalum formed by ionized metal plasma.

4. The method of claim 2, wherein the conformal adhesion layer includes tantalum nitride formed by ionized metal plasma.

5. The method of claim 1, wherein the conformal adhesion layer includes tantalum formed by ionized metal plasma.

6. The method of claim 1, wherein the conformal adhesion layer includes tantalum nitride formed by ionized metal plasma.

7. The method of claim 1, wherein the second conductive material includes copper.

8. The method of claim 1, the step of filling the second conductive material into the trench and the via hole further comprising:

forming a second conductive layer over the substrate that fills the trench and the via hole; and removing a portion of the second conductive layer and the adhesion layer to expose the dielectric layer.

9. The method of claim 8, wherein the step of removing the adhesion layer and the second conductive layer includes chemical-mechanical polishing.

10. A method for fabricating a dual damascene structure, comprising the steps of:

forming a dielectric layer over a substrate having a first conductive layer, wherein a cap layer is formed between the first conductive layer and the dielectric layer;

forming a trench and a via hole in sequence in the dielectric layer, wherein the via hole is aligned under the trench, and the via hole exposes a portion of the cap layer above the first conductive layer;

forming a barrier spacer on sidewalls of the trench and the via hole;

removing the portion of the cap layer exposed by the via hole to expose the first conductive layer;

forming a conformal adhesion layer over the substrate; and filling the trench and the via hole with a second conductive material.

11. The method of claim 10, wherein the cap layer includes silicon nitride formed by chemical vapor deposition.

12. The method of claim 10, the step of forming the barrier spacer on the sidewalls of the trench and the via hole further comprising:

forming a conformal barrier layer over the substrate; and etching back the conformal barrier layer.

13. The method of claim 12, wherein the barrier spacer includes titanium nitride formed by chemical vapor deposition.

14. The method of claim 13, wherein the step of forming the conformal adhesion layer includes ionized metal plasma.

15. The method of claim 10, wherein the step of removing the cap layer exposed by the via hole includes reactive ion etching.

16. The method of claim 10, wherein the conformal adhesion layer includes tantalum formed by ionized metal plasma.

17. The method of claim 10, wherein the conformal adhesion layer includes tantalum nitride formed by ionized metal plasma.

18. The method of claim 10, wherein the second conductive material includes copper.

19. The method of claim 10, the step of filling the second conductive material into the trench and the via hole further comprising:

forming a second conductive layer over the substrate that fills the trench and the via hole; and removing a portion of the second conductive layer and the adhesion layer to expose the dielectric layer.

20. The method of claim 19, wherein the step of removing the adhesion layer and the second conductive layer includes chemical-mechanical polishing.

* * * * *